US006897657B2

(12) United States Patent
Okada et al.

(10) Patent No.: US 6,897,657 B2
(45) Date of Patent: May 24, 2005

(54) NUCLEAR MAGNETIC RESONANCE SPECTROMETER FOR LIQUID-SOLUTION

(75) Inventors: Michiya Okada, Mito (JP); Tsuyoshi Wakuda, Hitachi (JP); Shigeru Kakugawa, Hitachi (JP); Hiroshi Morita, Hitachi (JP); Katsuzo Aihara, Hitachiota (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/099,978

(22) Filed: Mar. 19, 2002

(65) Prior Publication Data
US 2003/0076103 A1 Apr. 24, 2003

(30) Foreign Application Priority Data
Oct. 24, 2001 (JP) ........................................ 2001-325760

(51) Int. Cl.[7] ................................................. G01V 3/00
(52) U.S. Cl. ...................................................... 324/321
(58) Field of Search ................................ 324/300–302, 324/307–309, 316–321

(56) References Cited

U.S. PATENT DOCUMENTS

| | | | | |
|---|---|---|---|---|
| 3,559,043 A | * | 1/1971 | Hyde ........................ 324/316 |
| 3,764,892 A | | 10/1973 | Rollwitz | |
| 4,788,502 A | | 11/1988 | Keller et al. ................ 324/318 |
| 5,187,938 A | | 2/1993 | Mraz et al. .................. 62/51.1 |
| 5,220,302 A | | 6/1993 | Nunnally et al. ........... 335/301 |
| 5,278,503 A | | 1/1994 | Keller et al. ................ 324/318 |
| 5,508,613 A | | 4/1996 | Kotsubo et al. ............ 324/318 |
| 5,530,348 A | * | 6/1996 | Heflinger .................... 324/301 |
| 5,552,709 A | | 9/1996 | Anderson ................... 324/321 |
| 5,684,401 A | | 11/1997 | Peck et al. .................. 324/318 |
| 5,689,187 A | | 11/1997 | Marek et al. ............... 324/318 |
| 5,739,689 A | | 4/1998 | Roth et al. | |
| 5,754,048 A | | 5/1998 | Bielecki ...................... 324/321 |
| 5,814,992 A | | 9/1998 | Busse-Grawitz et al. ... 324/318 |
| 5,977,772 A | * | 11/1999 | Wand et al. ................ 324/321 |
| 6,046,592 A | | 4/2000 | Rathke et al. .............. 324/321 |
| 6,097,188 A | | 8/2000 | Sweedler et al. ........... 324/321 |
| 6,121,776 A | | 9/2000 | Marek ......................... 324/318 |
| 6,169,402 B1 | * | 1/2001 | Oka et al. ................... 324/318 |
| 6,198,281 B1 | * | 3/2001 | Wand et al. ................ 324/300 |

(Continued)

FOREIGN PATENT DOCUMENTS

| | | |
|---|---|---|
| JP | 6-237912 | 8/1994 |
| JP | 7-240310 | 9/1995 |

(Continued)

OTHER PUBLICATIONS

W.D. Markiewicz, et al., "900 MHz Wide Bore NMR Spectrometer Magnet at NHMFL", IEEE Transactions on Applied Superconductivity, vol. 10, No. 1, pp. 728–731.

(Continued)

*Primary Examiner*—Christopher W. Fulton
*Assistant Examiner*—Dixomara Vargas
(74) *Attorney, Agent, or Firm*—McDermott Will & Emery LLP

(57) ABSTRACT

In a nuclear magnetic resonance spectrometer, the shape of a detection coil is changed from a conventional cage type to a solenoid type of higher sensitivity. Accordingly, differing from the conventional superconductive magnet of multilayer air core solenoids, a superconductive magnet is right and left divided to split magnets for generating 11 T, preferably, 14.1 T in the horizontal direction, and the magnetic field uniformity is set to 0.001 ppm or less and the temporal stability is set to 0.001 ppm or less.

8 Claims, 12 Drawing Sheets

U.S. PATENT DOCUMENTS

| | | | |
|---|---|---|---|
| 6,362,624 B1 * | 3/2002 | Wand et al. | 324/321 |
| 6,486,672 B1 * | 11/2002 | Wand et al. | 324/321 |
| 6,570,475 B1 * | 5/2003 | Lvovsky et al. | 335/216 |
| 2003/0076104 A1 * | 4/2003 | Okada et al. | 324/321 |
| 2003/0210052 A1 * | 11/2003 | Okada et al. | 324/318 |
| 2004/0041565 A1 * | 3/2004 | Kakugawa et al. | 324/318 |

FOREIGN PATENT DOCUMENTS

| | | |
|---|---|---|
| JP | 7240310 | 9/1995 |
| JP | 11-248810 | 9/1999 |
| JP | 11312606 | 11/1999 |
| JP | 2000-147082 | 5/2000 |
| JP | 2000-266830 | 9/2000 |

OTHER PUBLICATIONS

"Magneto–optical superconducting magnet systems", Product Guide Spectromag, Oxford Instruments (UK) Limited, 1999, XP002255159.

T. Kiyoshi et al., "Development of 1 GHz Superconducting NMR Magnet at TML/NRIM", IEEE Transactions on Applied Superconductivity, vol. 9, No. 2, Jun. 1999, pp. 559–562.

* cited by examiner

NUCLEAR MAGNETIC RESONANCE SPECTROMETER FOR LIQUID-SOLUTION

BACKGROUND OF THE INVENTION

The present invention relates to a nuclear magnetic resonance spectrometer suitable for analyzing, in a liquid-solution, the structure and interaction of protein and organic molecules such as substrate and ligand interacting with the protein.

A method for analyzing organic matter utilizing nuclear magnetic resonance (NMR) has been making rapid progress in recent years. In particular, a method has been used in combination with the technique of strong superconductive magnets to make it possible to highly efficiently analyze the structure of an organic compound such as protein having a complicated molecular structure on atomic level. The present invention is directed to a nuclear magnetic resonance (NMR) spectrometer necessary for analyzing the structure on atomic level and interaction of protein molecules in an aqueous solution dissolving a small quantity of protein, especially, an energy spectrometer differing from a medical MRI diagnostic apparatus aiming at imaging of a tomogram of human body needing so-called millimeter class image resolution in that performance such as the magnetic field intensity being one order or more higher, the magnetic field uniformity being of four order and the stability being three order higher is needed, thus requiring quite different design technique and apparatus manufacture technique. A detailed description of a conventional high-resolution NMR spectrometer is given in "NMR for Protein" by Yoji Arata, published by Kyoritu-shuppan, pp. 33–54, 1996. As up-to-date inventions concerning the typical apparatus construction when the NMR is utilized for analysis of protein, one may refer to an invention relating to a superconductive magnet that shows the typical construction of a multilayer air-core solenoid coil as disclosed in JP-A-2000-147082, an invention relating to a signal detection technique that shows a cage type superconductive detection coil as disclosed in U.S. Pat. No. 6,121,776 and examples of signal detection technique based on a conventional barrel type or cage type coil as disclosed in JP-A-2000-266830 and JP-A-6-237912. According to these reports, all of the conventional high-sensitivity NMR spectrometers for protein analysis use a superconductive magnet unit constructed of solenoid coils used in combination to generate a magnetic field in the vertical directions, an electromagnetic wave at 400 to 900 MHz is irradiated on a sample and a resonance wave generated from the sample is detected by utilizing the barrel or cage type detection coil. Also, as shown in an example of U.S. Pat. No. 6,121,776, a contrivance is made to improve the S/N sensitivity ratio by utilizing a detector cooled to low temperatures with a view to decreasing heat noise during reception.

Historically, in the high-sensitivity NMR spectrometer, improvements in sensitivity have been achieved by a method in which the basic constituents of a system such as antenna and magnet are kept to remain unchanged but the center magnetic field intensity of the superconductive magnet is increased. Accordingly, the maximum NMR measurement sensitivity reported till now can be obtained with a NMR spectrometer at 900 MHz utilizing a large superconductive magnet having a center magnetic field of 21.1 tesla and the basic constituents of the spectometer remain unchanged as compared to those in the prior art of JP-A-2000-147082. In the analysis of protein using a liquid-solution, the improved center magnetic field is effective to clarify separation of improvement in sensitivity and chemical shift.

In attaining the effect of improved sensitivity attributable to the form or shape of detection coil, it has been known, for example, as described in "Book of NMR" by Yoji Arata, published by Maruzen, PP. 325–327, 2000, that the solenoid coil conventionally used as detection coil is advantageous over the barrel or cage type in various points. For example, the solenoid coil is advantageous in easy controllability of impedance, filling factor and efficiency of RF magnetic field. But, according to the literature, when the sensitivity is thought much of in such an application of measuring protein dissolved by a small quantity in an aqueous solution, winding a solenoid coil around a sample tube placed vertically to the magnetic field is practically impossible and in general, is not utilized. In an exceptional application where highly sensitive measurement is carried out by using a small quantity of sample solution, the above technique is limitedly utilized through a method utilizing a particularly designed micro-sample tube to carry out measurement by using a special probe.

Recently, in a special example disclosed in JP-A-11-248810, a method is contrived according to which a bulky magnet of high-temperature superconductivity is magnetized in the horizontal direction and a NMR signal is detected with a solenoid coil. Further, JP-A-7-240310 discloses a method for constructing a superconductive magnet and a cooling container to meet a general NMR application directed to eliminate constraints on the top or ceiling height of apparatus. However, any method of improving the detection sensitivity necessary for analyzing protein and any method of technically coping with magnetic field uniformity and temporal stability of magnetic field have not been known yet.

Recently, with needs for study of protein promoted, needs for analyzing a sample in which protein has a small degree of solubility to water have increased and there is a need of improving the sensitivity of measurement of NMR. To adapt the NMR spectrometer to the needs as above, the measurement sensitivity must be improved while maintaining a sample space comparable to that of the conventional apparatus and besides the maintenance of the stability of a superconductive magnetic field over a long time of data integration is indispensable. The improved measurement sensitivity is particularly advantageous in that for samples having substantially the same solubility, not only the measurement time can be shortened but also the sampling amount can be decreased, thereby ensuring that the protein of small solubility can be analyzed to advantage. Accordingly, the NMR spectrometer used for analysis of protein is required of far more excellent detection sensitivity and stability than those in the conventional NMR and in addition, is required to have ability to detect NMR signals accurately and stably over a long time of one week or more. This is because if the magnetic field varies during measurement, the peak of NMR signal is caused to shift and especially, in measurement of interaction, the peak shift due to interaction cannot be discriminated from that due to instability of the magnetic field. If the magnetic field is non-uniform, desired peaks overlap each other, raising a problem that discrimination of interaction is difficult to achieve. Therefore, it should be noticed that, in future NMR techniques aiming at performing various kindes of analysis of protein, development of new technology not lying on mere extension of the conventional general NMR spectrometers will be needed.

For example, specification of magnetic field uniformity in the general NMR spectrometer is 0.01 ppm in a sample space, that is, 0.01 ppm in terms of temporal stability. When this value is indicated in terms of proton NMR for general 600 MHz use, a permissible error of 6 Hz results. In the case of the aforementioned analysis of interaction of protein, however, spatial and temporal resolution of at least 1.0 Hz or less is required and preferably, 0.5 Hz or less is needed. In a method capable of implementing the magnetic field stability and the temporal stability of magnetic field, the construction of superconductive magnet and detection coil must be optimized. Accordingly, the performance of the conventional, generally-used NMR spectrometer is insufficient and the stability and magnetic field uniformity higher by one order or more than those of the conventional spectrometer are required.

In the prior arts, the sensitivity is managed to be improved by relying on improvements in magnetic field intensity and as a result, the apparatus is increased in size and to cope with problems of leakage magnetic field and floor strength, there arises a new problem of installation capability such as needs for a dedicated building. Further, disadvantageously, the cost of a superconductive magnet increases. The improved sensitivity has an upper limit of about 21 T because of constraints due to a critical magnetic field of a superconductive material and for more upgraded improvements in sensitivity, the advent of a technique for improving detection sensitivity based on a new means without resort to the magnetic field intensity has been desired.

The aforementioned high-sensitivity measuring method utilizing the solenoid coil can be used with a special sample tube for a very small quantity of sample and a special detection probe but it cannot be applied to analysis based on a general protein solution of about 10 cc. The method for generating a magnetic field in the horizontal direction by means of a strong magnet and detecting NMR signals by means of a solenoid coil as described in the example of JP-A-11-248810 can generate only a magnetic field of not greater than 10 T at the surface of a high-temperature superconductor, with the result that the magnetic field at a sample part is about several tesla at the most, thus proving that the method of interest cannot generate a magnetic field of 11 tesla or more necessary for analysis of protein, preferably, a magnetic field of 14.1 tesla or more in a desired sample space. Further, in this method, owing to the effect of a magnetic flux creep phenomenon of the high-temperature superconductor, the temporal stability 1.0 Hz/hour or less necessary for analysis of protein is substantially difficult to achieve. As regards the magnetic uniformity necessary for analysis of protein, non-homogeneity attributable to the manufacture process of a high-temperature superconductive bulky material also makes it difficult to attain the magnetic field uniformity within 1.0 Hz in terms of proton NMR frequency in a space defined by 10 mm diameter×20 mm length.

As described above, while a breakthrough technique meeting the needs for analysis of protein is desired to be developed in connection with the conventional techniques, the advent of a new solving method for further improvements in sensitivity has been desired under the present-day circumstances that improving the sensitivity based on the magnetic field has reached limits.

For the purpose of conducting an efficient and accurate. Analysis of the interaction of protein in a liquid-solution with low molecules such as substrate and ligand, for which needs are considered to increase in future, it is empirically preferable that a suitable quantity of sample be measured at 600 to 900 MHz and with a center magnetic field of about 14 to 21 T and the measurement sensitivity be increased beyond the present one to increase the throughput. Generally, in a spectrometer operating at 800 MHz or more, for the purpose of making full use of the superconductive characteristics to an extreme, operation is carried out by depressurizing liquid helium at 4.2 K and excessively cooling it to 1.8 K. Therefore, complexities in apparatus operation are aggravated and maintenance is laborious. In addition, the magnetic unit increases in size to increase leakage magnetic field and typically, a dedicated building is needed. Especially, the leakage magnetic field in the vertical direction increases as the center magnetic field increases in the conventional system, so that in an apparatus of 900 MHz class, for instance, a leakage magnetic field occurs extending up to 5 m in the height direction, and from the viewpoint of apparatus installation, there needs a tall building of high ceiling. As a result, the construction cost increases disadvantageously. Further, the conventional 900 MHz superconductive magnet is sized such that only a magnet part has a diameter of 1.86 m and a height of several meters, as described in IEEE. Transactions on Applied Superconductivity, Vol. 10, No. 1, page 728–731.

The present invention intends to provide a novel NMR spectrometer in which the measurement sensitivity of NMR signals can be increased by at least 2.5 times or more of that in the conventional apparatus at about 600 MHz (14.1 T) under a condition that a normal sample tube of 5 to 10 mm diameter is mainly used and a sample liquid-solution is charged in the tube up to a height of about 30 mm and the temporal stability and spatial uniformity of a superconductive magnet necessary for analysis of protein can be provided. In the construction of the present invention, the operating temperature of a system is not set to 4.2 K. By applying the present invention, it is also possible to aim at achieving extremity performance but depending on applications, operation at the conventional magnetic field limit 21.1 T, that is, at 900 MHz and at 1.8 K can proceed and in that case, the sensitivity can be improved by 40% of that in the conventional system, proving that overcoming the detection sensitivity limit attributable to magnetic field intensity, conventionally unattainable, can succeed for the first time.

SUMMARY OF THE INVENTION

The present inventors have studied earnestly and deeply to find problems common to the present-day NMR spectrometers and contrive countermeasures thereagainst.

To maintain compatibility between costs and installation capability, the present-day NMR spectrometer has developed through a method in which a liquid-solution sample is placed in the center of a multilayer air-cored solenoid coil having excellent magnetic field uniformity and a signal is detected by a barrel or cage type antenna. Historically, as the NMR technology has advanced from a low magnetic field of 400 MHz or less thanks to the advance of measuring technique and analytical method, the measuring sensitivity has been improved by strengthening the center magnetic field while observing the fundamental form. Recently, an example using a cage type antenna of superconductive type with the aim of reducing heat noise has also been reported. The present inventors have studied earnestly and deeply a method capable of making the signal intensity far higher than that in the conventional system while keeping the magnetic field identical to find that this problem can be solved according to features of the invention to be described below.

According to one feature of the invention, the sensitivity is improved by applying a detection coil of solenoid type under conditions that the magnetic field is 400 MHz or more, preferably, about 600 MHz to 900 MHz suitable for NMR of a liquid-solution defined by a sample space having a diameter of 5 to 10 mm and a height of 20 mm and the detection coil has a diameter of 5 to 10 mm and a height of about 20 mm to permit a normal sample tube for NMR research to be used as it is. In principle, it can be expected that the sensitivity can be improved at least 2.5 times by a difference in shape factor of the detection coil and can be further improved by virtue of other factors, with the result that integrating time of data can be shortened to 1/10 or less. The liquid-solution sample is inserted vertically from above into the sample tube of 5 to 10 mm diameter up to a height of about 20 to 30 mm. In order to detect NMR signals with high sensitivity by means of the solenoid coil having its winding axis in the vertical direction, it is necessary that a magnetic field generated by a superconductive a magnet be oriented in the horizontal direction and the liquid-solution sample be placed removably in the center of the magnetic field. To this end, the superconductive magnet must be constructed of right and left divided, paired split magnets in contrast to the conventional simplified solenoid magnet. Here, to meet the special analytical utilization of analyzing protein dissolved in the liquid-solution, design and manufacture of the superconductive magnet must be optimized to meet the aforementioned temporal stability of 1.0 Hz/hour in terms of proton NMR frequency and spatial uniformity of 1.0 Hz or less in the sample space. This design is more stringent by one order or more than the conventional design and is beyond the range of construction achievable by simply combining the known techniques. Therefore, each of the split magnets is subjected to sufficient design and study for the purpose of generating a highly precise magnetic field of 0.000 ppm that is a limit of effective figure on computers and thereafter optimally arranged and combined with a coil of a superconductive conductor for high magnetic field made of $Nb_3Sn$ for instance and a superconductive coil for low magnetic field made from a NbTi superconductive conductor. There is no example of constructing a general-purpose liquid-solution protein analyzing NMR spectrometer using the split magnets. The inventors have studied earnestly and deeply and found, for the first time in the world, that the temporal stability and spatial stability applicable to the analysis of protein, that is, within 1.0 Hz in the sample space and within 1.0 Hz per hour in terms of proton NMR frequency can be accomplished by means of the present spectrometer. A magnet optimizing technique the present inventors have accumulated earnestly makes it possible to design a uniform magnetic field of a complicated split coil system, such a design being difficult to achieve in the past. It is found that the size of a magnet part including a low temperature container can be compacted to be of about 1 m width and 1 m height per unit to thereby ensure that a space saved, highly integrated experimental apparatus can be constructed while suppressing the leakage magnetic field and a liquid-solution NMR spectrometer of high throughput having an integrating time of data about 10 times the integrating time in the conventional system can be provided.

More specifically, in a NMR spectrometer for liquid-solution which comprises a superconductive magnet, a high-frequency transmission coil and a reception coil and in which a sample dissolved in a liquid-solution is charged in a sample tube up to a height of about 10 to 30 mm, the sample tube being inserted vertically from above and having a diameter of 5 to 10 mm, a stationary magnetic field generated by the superconductive magnet is 11 T or more, preferably, 14.1 T or more, the direction of the magnetic field generated by the superconductive magnet is in the horizontal direction, a change per hour of proton NMR frequency due to a change of the stationary magnetic field is 1.0 Hz or less, the magnetic field uniformity in a sample space is 1.0 Hz or less in terms of proton NMR frequency, the liquid-solution sample is inserted substantially vertically from above and placed, and the reception coil is a solenoid coil placed near the magnetic field center from below the apparatus, whereby a small quantity of protein charged in the sample tube of 5 to 10 mm diameter can be analyzed with high sensitivity.

Further, according to the invention, in a NMR spectrometer which comprises a superconductive magnet, a high-frequency transmission coil and a reception coil and in which a sample such as protein dissolved in a liquie-solution is charged in a sample tube up to a height of about 10 to 30 mm, the sample tube being inserted vertically from above and having a diameter of 5 to 10 mm, a stationary magnetic field generated by the superconductive magnet is 11 T or more, preferably, 14.1 T or more, the direction of the magnetic field generated by the superconductive magnet is in the horizontal direction, a change per hour of proton NMR frequency due to a change of the stationary magnetic field is 1.0 Hz or less, the magnetic field uniformity in a sample space is 1.0 Hz in terms of proton NMR frequency, the liquid-solution sample is placed substantially vertically from above in the magnetic field center, and the reception coil is a solenoid coil made of a superconductive material, placed from below the apparatus and cooled to a superconductivity revealing temperature or less.

Preferably, the organic sample may be a polymer compound, protein or ligand.

Preferably, the superconductive magnet is paired split magnets for generating a magnetic field in the horizontal direction.

The supercoductive magnet may be a toroidal magnet placed horizontally.

Further, according to the invention, in a NMR spectrometer which comprises a superconductive magnet, a high-frequency transmission coil and a reception coil and in which a sample such as protein dissolved in a liquid-solution is charged in a sample tube up to a height of about 10 to 30 mm, the sample tube being inserted vertically from above and having a diameter of 5 to 10 mm, a stationary magnetic field generated by the superconductive magnet is 11 T or more, preferably, 14.1 T or more, the superconductive magnet is a toroidal magnet placed in the horizontal direction, a change per hour of proton NMR frequency due to a change of the stationary magnetic field is 1.0 Hz or less, the magnetic field uniformity in a sample space is 1.0 Hz or less in terms of proton NMR frequency, a plurality of liquid-solution samples are placed circumferentially of the toroidal coil at intervals of substantially equidistance, and the reception coil corresponding to each sample is a solenoid coil made of a superconductive material, placed from below the apparatus and cooled to a superconductivity revealing temperature or less.

Further, the superconductive magnet is a toroidal magnet placed horizontally and the magnetic field intensity applied to the individual samples is regulated to clearly discriminate NMR signals generated from adjacent plural samples from each other.

Structurally, in the liquid-solution NMR spectrometer according to the invention, the liquid-solution sample is placed from above the apparatus in the magnetic field center, the detection coil is a solenoid coil placed from below the apparatus in the magnetic field center, the direction of the magnetic field is horizontal, and the superconductive magnet is right and left divided.

The present invention is in no way limited to the features set forth so far and the above and other features will be described in greater detail in the following.

According to the invention, there is provided a novel NMR spectrometer in which the measurement sensitivity of NMR signals can be increased by at least 2.5 times or more of that in the conventional apparatus at 600 MHz (14.1 T) under a condition that the normal sample tube of 5 to 10 mm diameter is mainly used and a sample liquid-solution is charged in the tube up to a height of about 30 mm, and the temporal stability and spatial stability of a superconductive magnet necessary for analysis of protein can be provided. Further, when the apparatus is operated at 21.1 T, that is, 900 MHz and at 1.8 K, the sensitivity can be largely improved in comparison with the conventional apparatus and the detection sensitivity limit attributable to the magnetic field intensity, which cannot be overcome conventionally, can be overcome remarkably for the first time.

DESCRIPTION OF THE EMBODIMENTS (Embodiment 1)

Figure 1:
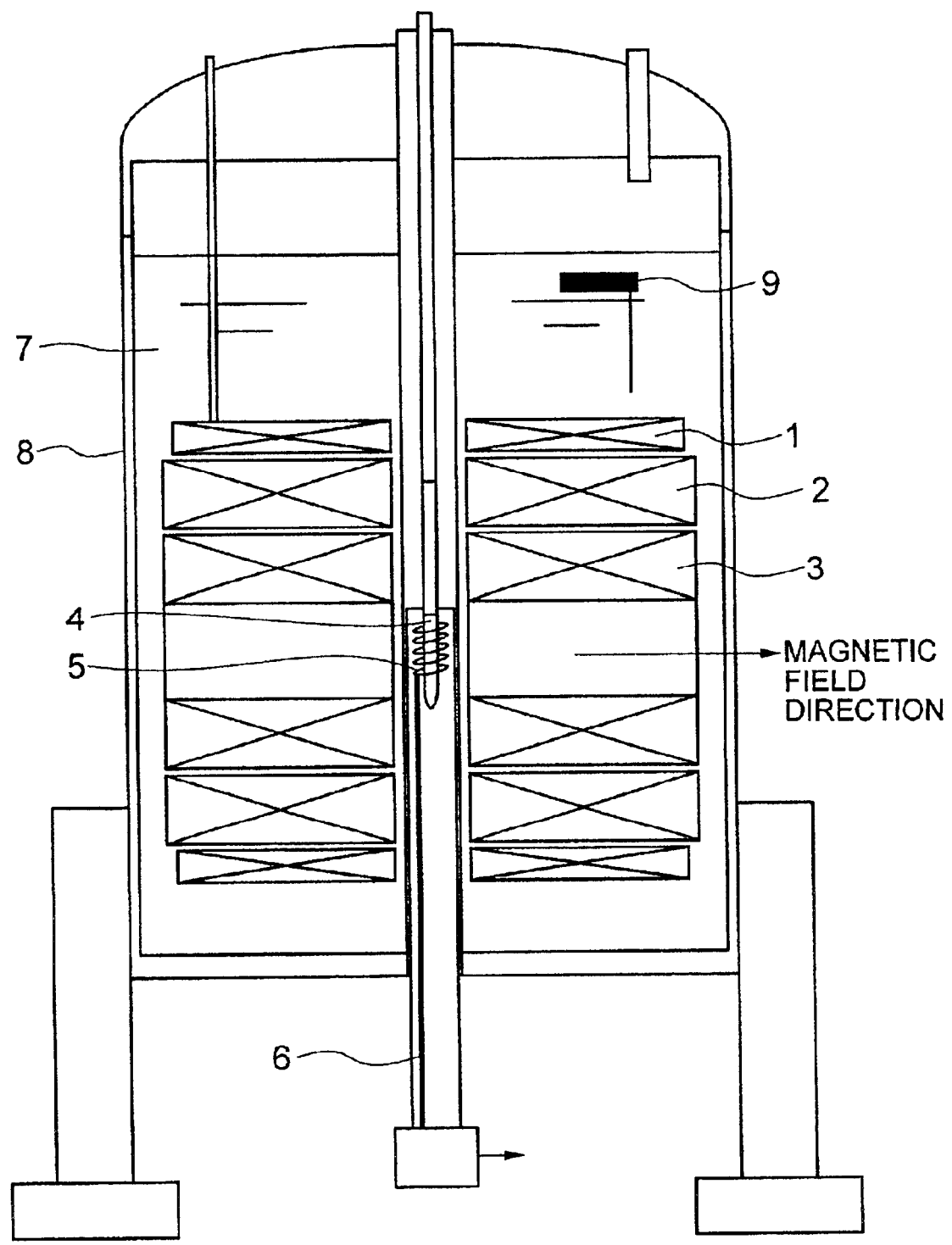
FIG. 1 is a diagram showing an example of construction of a NMR spectrometer system of the invention.

A first embodiment of the present invention is shown in FIG. 1. Of superconductive magents 1, 2 and 3, an inner one closer to a sample has a coil made of a material of higher superconductivity critical magnetic field. For example, coils of the superconductive magnets 1, 2 and 3 are made of $Nb_3Al$, $Nb_3Sn$ and NbTi, respectively, but as necessary, they may optimally be combined with each other to provide a desired value of a magnetic field generated by the coils and a desired value of uniformity. As an example, either a superconductive material of a Bi system such as $Bi_2Sr_2CaCu_2O_9$ or of a $Y_1Ba_2Cu_3O_7$ or $MgB_2$ may be used. The superconductive magnets having the coils combined as above generate a magnetic field in the horizontal direction. In FIG. 1, a protein sample 4 dissolved in an aqueous solution is charged in a sample tube up to a height of 30 mm, the sample tube having a diameter of 5 to 10 mm and being made of glass possessing magnetic properties equivalent to those of water, and is inserted in the magnetic field center from above the apparatus so as to be placed vertically. The magnetic field is applied to the sample laterally thereof. Accordingly, the superconductive magnets have each the coil wound solenoidally about a horizontal winding axis and are each placed in right and left symmetry. The magnets are integrated or unified compactly to have a maximum width of 400 mm and a maximum height of 700 mm. In the center of the thus integrated magnet, the uniformity of magnetic field is regulated to 0.001 ppm or less, that is, 0.5 Hz or less in terms of proton NMR frequency and the temporal stability is 0.001 ppm/hour or less, that is, 0.5 Hz/hour or less in terms of proton NMR frequency. In this case, a coil for uniformity adjustment may be disposed near the magnetic field center, as necessary. The adjustment may be made by using a conductor in the normal temperature region or another superconductor in the low temperature region or by using the two in combination. For example, when the apparatus is used for NMR at a proton NMR frequency of 600 MHz, the center magnetic field is set to about 14.1 T and the magnetic field uniformity is set to 18 mm sphere, that is, 0.5 Hz or less in terms of proton NMR frequency. Under this condition, the operating temperature of the coil can be set to 4.2 K and pumping of liquid helium is unneeded, thus ensuring easy operation. The sample is inserted vertically.

According to the present system, since the magnetic field is generated in the horizontal direction and the sample is inserted vertically from above, there is no fear of dropping the liquid-solution charged in the test tube. Structurally, the detection coil is inserted from below and therefore, a sufficient sample space can be assured, thus making it possible to make full use of the sample space in the measurement needing the sensitivity for analysis of protein. Depending on a measurement condition, the sample may be rotated. Even in case the detection coil system is cooled to low temperatures, concentration of the sample and additives can be changed continuously with the arrangement as above and hence various condition changes can be made easily in the study of interaction of protein. For detection of NMR signals, a solenoid coil made of cupper and maintained at normal temperature or a solenoid coil made of a Y system or $MgB_2$ and cooled to 10 to 20 K is used and structurally, it is used as a detection coil 5 for antenna that is inserted in the magnetic field center from below the apparatus so as to be arranged circumferentially of the glass tube charged with the sample liquid-solution, whereby a detected signal is transmitted to the outside through a signal cable 6. By virtue of insertion of the detection coil from below the apparatus, the sample space can be broadened and vibratory noise from the measurement system to the sample can be reduced. The supercoductive magnet is held in the permanent current mode by means of a permanent current switch 9 and the temporal variation of magnetic field is adjusted to 0.5 Hz or less/hour. The superconductive magnet is dipped in liquid helium 7 so as to be kept at low temperatures and its outer periphery is covered with liquid nitrogen 8, thus forming a double structure serving as a low temperature container capable of saving consumption of helium. Instead of cooling with liquid helium, a refrigerator free from problems of vibration, for example, a pulse tube refrigerator can be used to directly cool the superconductive magnet. Reduction of leakage magnetic field around the magnet is important from the viewpoint of installation capability and safety of the apparatus and structurally, the magnet can be provided with a magnetic shield meeting an installation condition.

Figure 7:
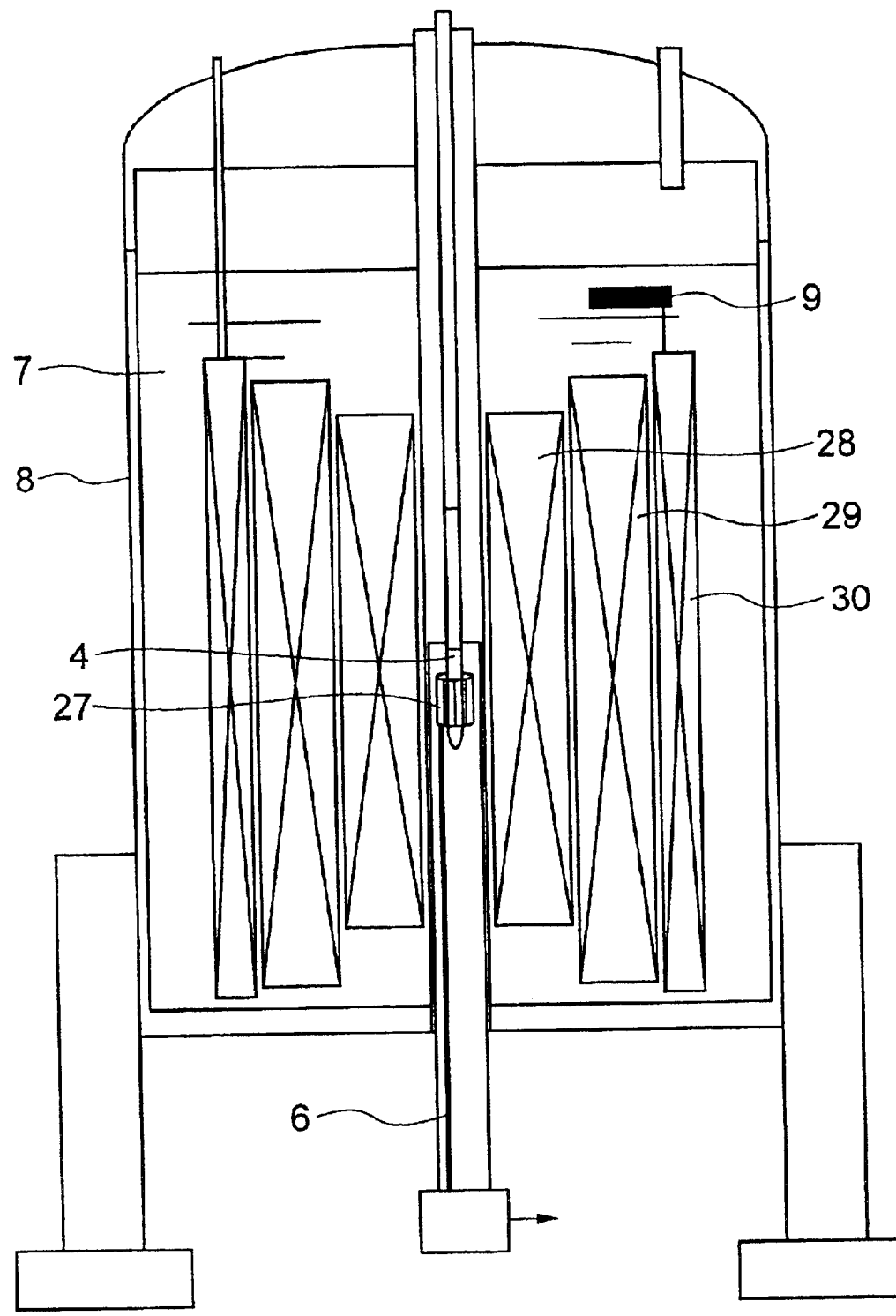
FIG. 7 is a diagram showing construction of a NMR spectrometer in a comparative example.

As described above, with the above construction, 600 MHz in terms of proton NMR frequency can be obtained with the 14.1 T center magnetic field in the present embodiment. In comparison with a comparative example of conventional NMR system as shown in FIG. 7, the signal/noise ratio (S/N) can be about 2.5~2.8 times improved, so that in NMR signal integrating measurement, data integration time can be speeded up by about 10 times for the sample dissolved with protein of 20 K molecular weight having the same sample concentration. This is measurement time performance comparable to that obtained when the same experiment is observed with a NMR spectrometer corresponding to 1.5 GHz. By providing the magnetic shield, interference with other analyzers surrounding the apparatus can be decreased and the density of installation of instruments can be promoted to advantage.

In the case of 600 MHz, a 5 gauss line of a leakage magnetic field from the apparatus is 2 m distant in the vertical direction and maximally 3 m distant in the horizontal direction. Through this, the apparatus for NMR data of the same quality as that obtained at 1.5 GHz can be installed without utilizing a special dedicated building.

(Embodiment 2)

Figure 2:
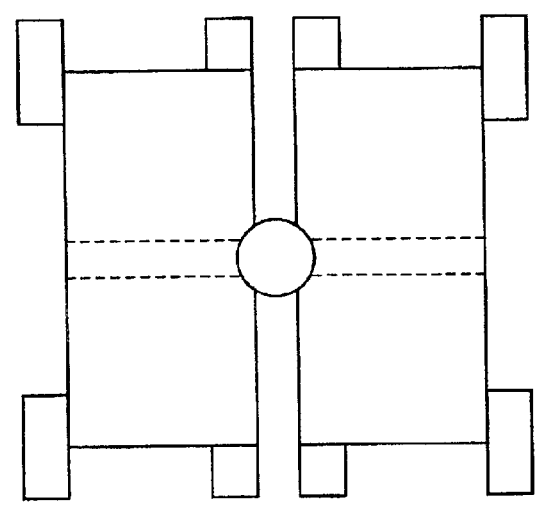
FIG. 2 is a diagram showing an example of construction of an open-type NMR spectrometer system of the invention.
Figure 2:
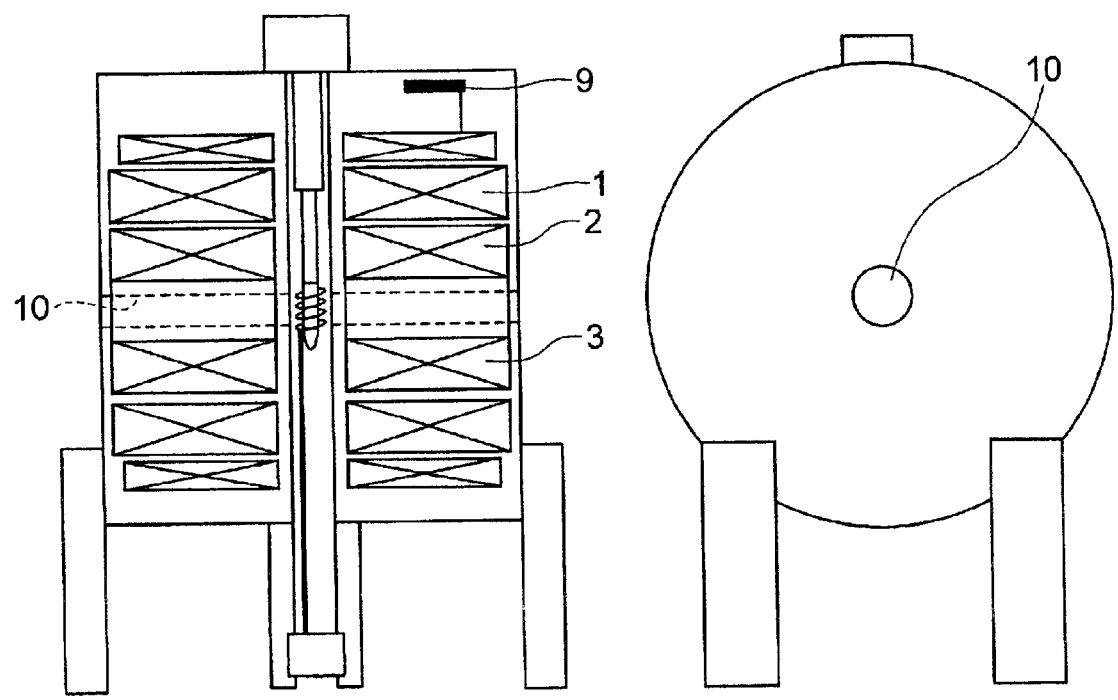

A second embodiment of the invention is shown in FIG. 2. Structurally, the present embodiment is substantially the same as the first embodiment but the low temperature container is divided in correspondence with the left and right divisions of superconductive magnet to make the user's space utilization releasable. Namely, in contrast to the conventional hermetical sample space, there is an open space around the sample chamber and therefore, dynamic behavior of protein can be measured by, for example, irradiating light or laser rays on the sample. Since a dynamic NMR signal as above can be observed, signal transmission or photosynthesis of protein, for instance, can be examined. In the case of a special experiment as above, by cooling the superconductive magnet through pumping of liquid helium to operate it at 1.8 k, the apparatus can be operated at a center magnetic field of about 900 MHz (21.1 T). The detection sensitivity in this case is comparable to that in NMR at 2.5 GHz obtained with an apparatus converted into the conventional type of NMR spectrometer shown in FIG. 7, indicating that this is comparable to an intensive magnetic field of 58.75 T extremely exceeding the conventional critical magnetic field by the superconductive material. Consequently, the detection sensitivity at such a high level unattainable by the conventional system can be realized with the magnetic field intensity at 2.5 GHz (58.75 T) according to the invention. In this case, the magnitude of a leakage magnetic field in the vertical direction of the apparatus according to the present invention also differs greatly from that in the conventional NMR spectrometer of 900 MHz class, amounting to 3 m distance in the vertical direction and maximally 4.5 m distance in the horizontal direction or coil axis direction.

(Embodiment 3)

Figure 3:
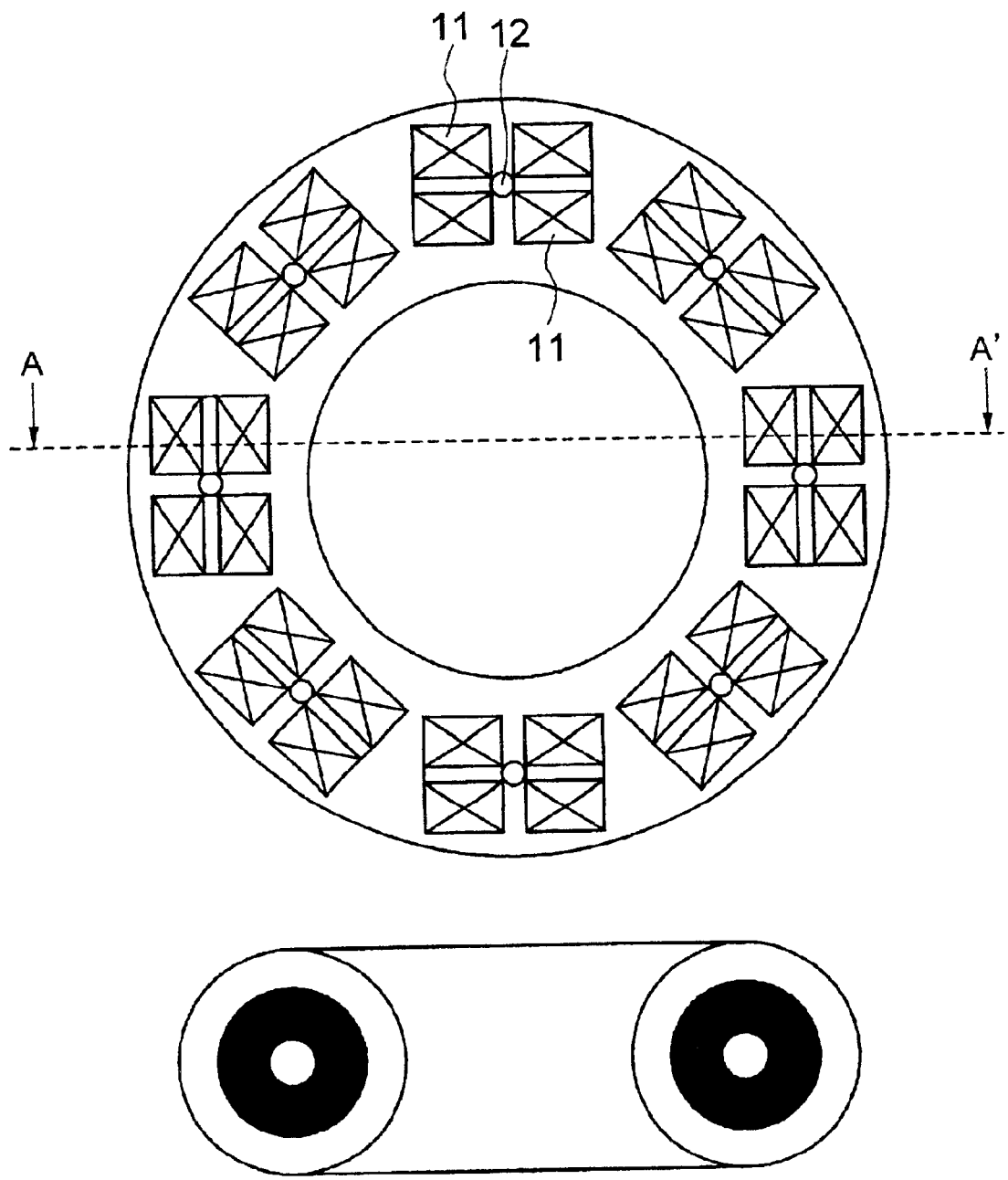
FIG. 3 is a diagram showing an example of construction of a toroidal type NMR spectrometer system of the invention.

A third embodiment of the invention is shown in FIG. 3. Structurally, in the present embodiment, 8 pairs of superconductive magents 11 are arranged toroidally in the horizontal direction with a view to reducing the leakage magnetic field and enhancing the integration or intensiveness of apparatus. More particularly, 8 NMR spectrometers are juxtaposed in a single low-temperature container cooled with liquid helium. Each of the 8 pairs of split magnets can be constructed as detailed in connection with the first embodiment to generate, for example, about 600 MHz. Preferably, however, the frequency referenced to 600 MHz may be changed by 10 Hz between adjacent NMR spectrometers. For example, 610 MHz, 620 MHz, 630 MHz and so on are available. This is advantageous in that even for the same sample 12, NMR signals of the different spectrometers can advantageously be discriminated from each other. With this construction, since the intensiveness of the NMR spectrometers highly integrated in a space of a diameter of 5 m to 10 m can be ensured and therefore, a highly economical NMR spectrometer system of high throughput, reduced in costs of installation and maintenance, can be provided.

(Embodiment 4)

Figure 4:
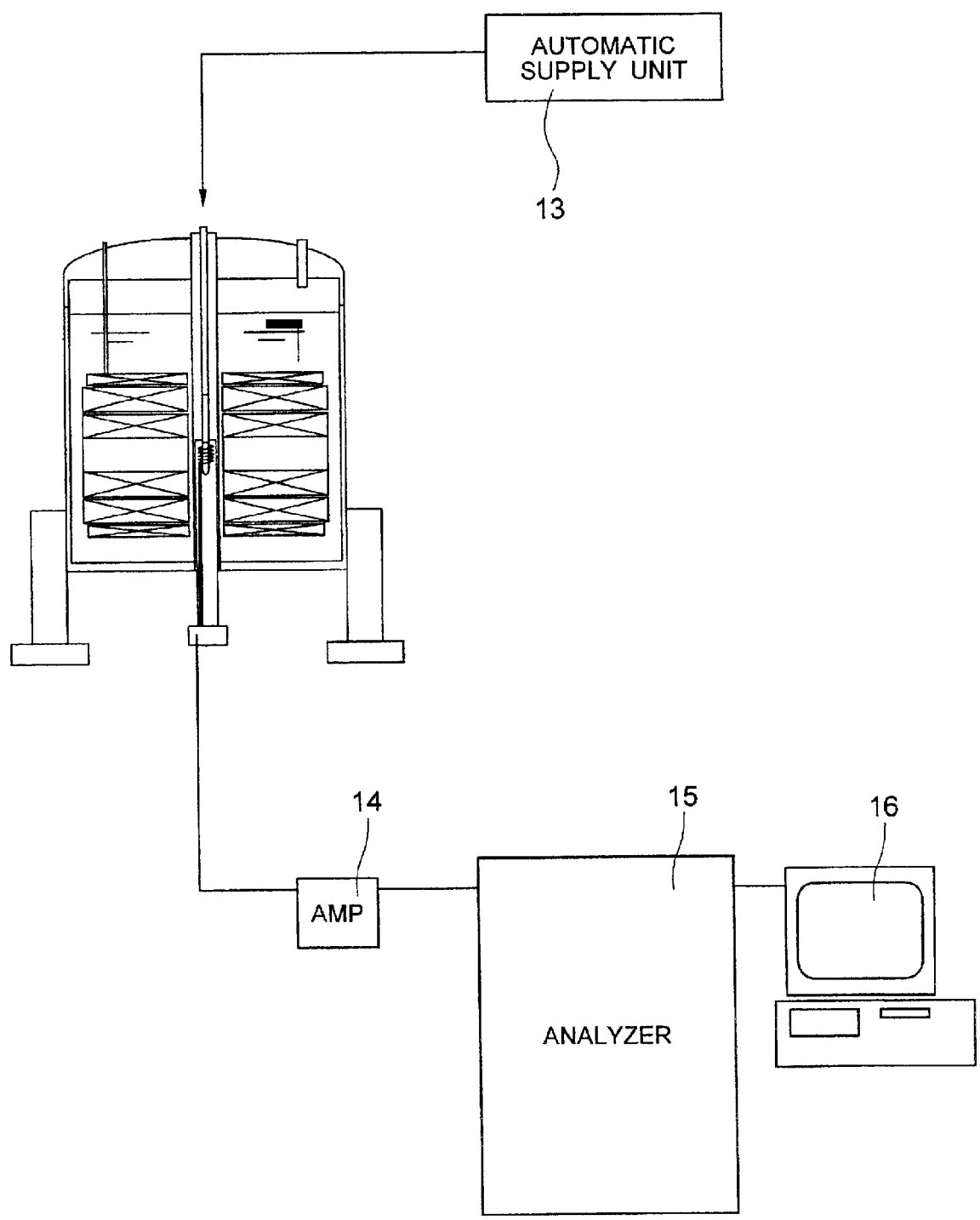
FIG. 4 is a diagram showing an example of construction of a NMR signal detection system of the invention.

A fourth embodiment of the invention is shown in FIG. 4. In the present embodiment, an example of construction of a NMR system of the invention will be described. For supply of liquid-solution sample, an automatic supply unit 13 such as flow cell is used to continuously provide desired concentration, a substrate, ligand or additives such as metal elements. In this manner, a system suitable for study of interaction of protein can be constructed. A NMR signal is sent through an amplifier 14 to an analyzer 15 controllable by a workstation 16. For acquisition of NMR signals, various kinds of pulse sequence are applicable. As necessary, a pulse is transmitted and the pulse sequence can be combined with a gradient magnetic field. For reduction of heat noise of signal, the amplifier 14 cooled to nearly liquid nitrogen temperature can be used.

(Embodiment 5)

Figure 5:
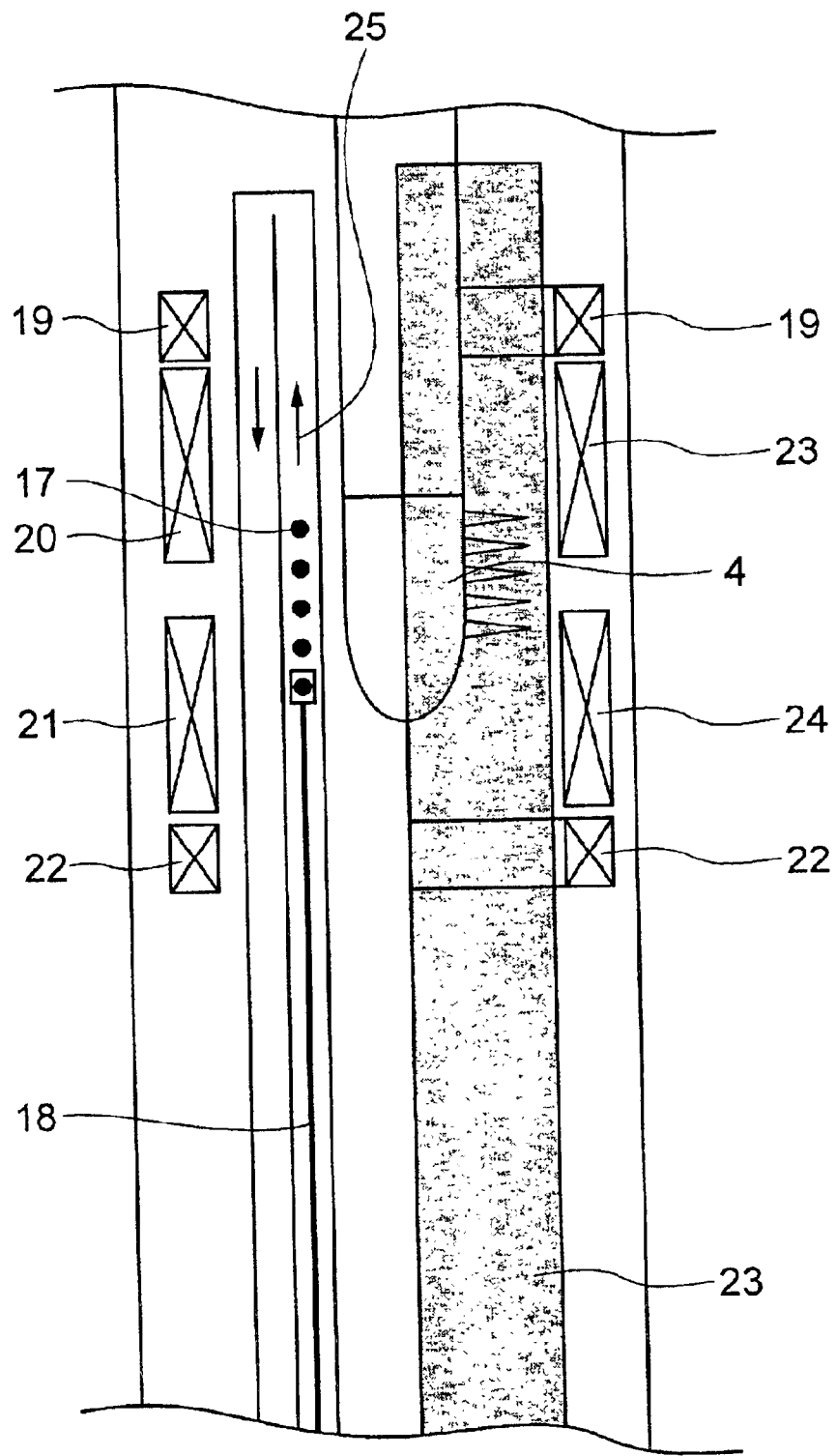
FIG. 5 is a diagram showing an example of construction of a NMR detection coil system of the invention.

A fifth embodiment of the invention is shown in FIG. 5. Illustrated in FIG. 5 are details of construction of a detection probe of the invention. A sample 4 is protein dissolved in an aqueous solution. The sample 4 is inserted in a glass tube of 5 to 10 mm diameter having properties equivalent to those of water and is placed from below the apparatus in the magnetic field center. A detection coil 17 in the form of a solenoid is made of a material of copper or superconductor. In the case of the superconductor, the detection coil is cooled with helium gas 25 to about 10 to 20 K. In the case of copper conductor, the detection coil is maintained at normal temperature. The sample may be rotated as necessary.

Coils 19, 20, 21, 22, 23 and 24 for three-axes gradient magnetic field are used in combination to apply a desired magnetic field gradient in a desired direction and they are combined with the pulse sequence so as to be utilized for analysis. A detected signal is sent to a pre-amplifier by a lead line 18.

According to the present invention, the sensitivity can be improved without resort to the detection coil using a superconductor, thus attaining the effects that the maintenance capability can be excellent and applicability to the light irradiation experiment described in connection with embodiment 2 can be permitted. In addition, by making the detection coil solenoidal and superconductive, the sensitivity can be improved by 2.5 times or more of that in the conventional apparatus and for example, when 900 MHz (21.1 T) is applied, the detection sensitivity corresponding to the conventional 2.5 GHz (58.75 T) can be obtained to ensure that the detection sensitivity unattainable conventionally can be realized to advantage.

(Embodiment 6)

Figure 6:
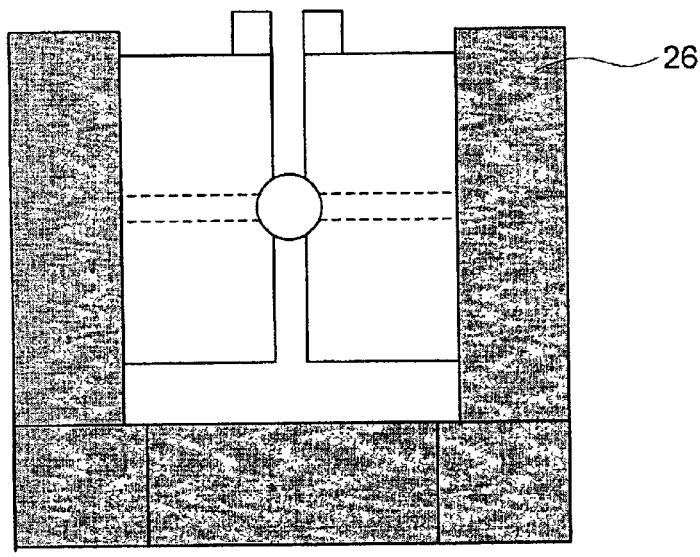
FIG. 6 is a diagram showing an example of construction of a magnetic shield in the NMR spectrometer system of the invention.
Figure 6:
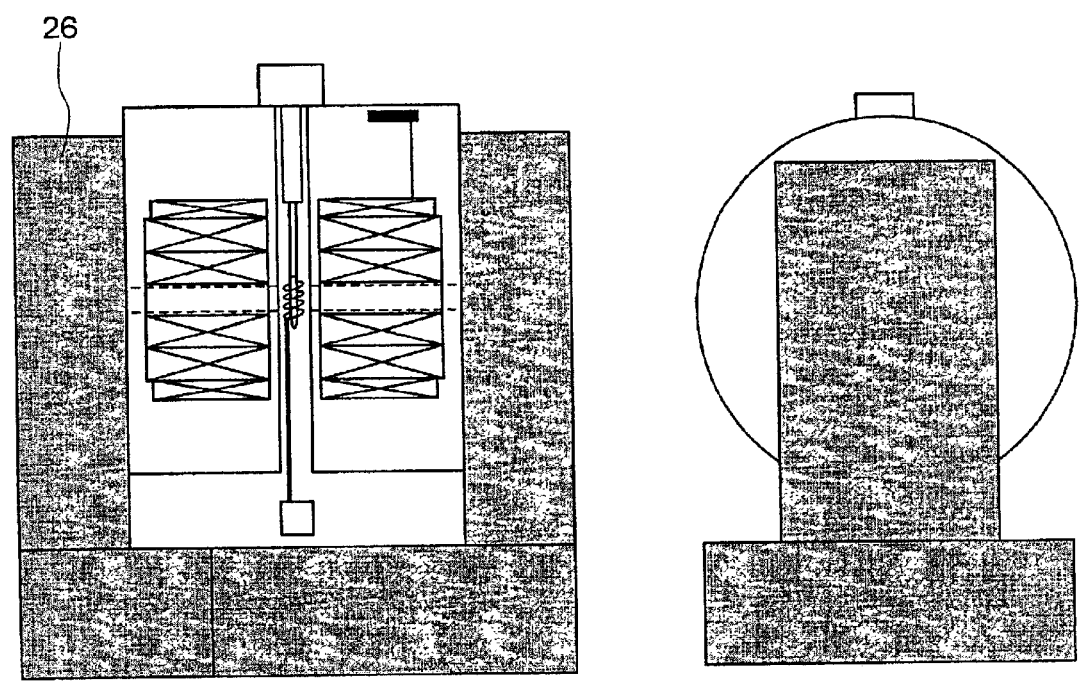

A sixth embodiment of the invention is shown in FIG. 6. The fundamental construction is the same as that in embodiment 2 of the invention. To reduce the leakage magnetic field, a combination with a magnetic shield made of iron is employed. By virtue of the combination with a return yoke 26 using iron, the leakage magnetic field to surrounding can advantageously be reduced to within 2 m distance. As necessary, an active shield utilizing a superconductive magnet can be used as the magnetic shield. This is meritorious in that in comparison with iron, weight can be reduced. In addition, iron may be used in combination with the active shield.

Comparative Example 1

As an example of NMR spectrometer construction comparative with that of the present invention, the construction of a NMR spectrometer of 600 MHz class is shown in FIG. 7. The center magnetic field is 14.1 T. Illustrated are a cage-shaped reception coil 27 and a multiplayer air-core solenoid of superconductive magnets 28, 29 and 30. In order to improve the sensitivity equivalently to the present invention with this conventional detection method, there is nothing but only a way to increase the center magnetic field. At present, however, 21 T is a limit and for the same frequency (center magnetic field intensity), the detection sensitivity is about ⅓ inferior to that of the present invention. The uniformity and temporal stability of the magnetic field are lower than 0.5 Hz that is necessary for analysis of protein.

Comparative Example 2

Figure 8:
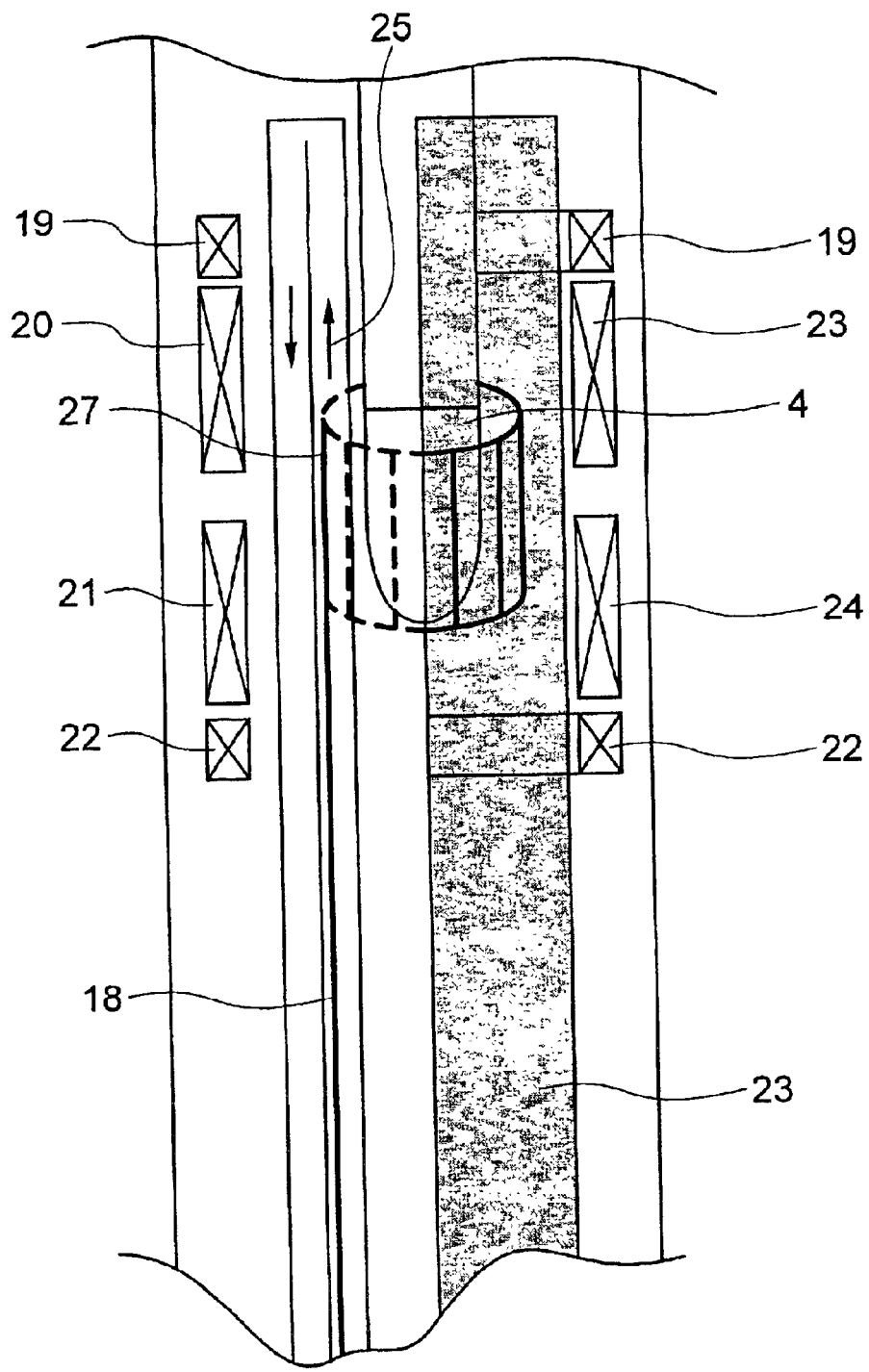
FIG. 8 is a diagram showing construction of a detection coil in a comparative example.

As an example of NMR spectrometer construction comparative with the present invention, the construction of a cage probe 27 is shown in FIG. 8. A barrel coil may sometimes be used but in a method in which it is combined with the comparative example 1, the same detection sensitivity as that in embodiment 1 of the invention cannot be obtained. In order to improve the sensitivity with this conventional method, there is nothing but a way to decrease the temperature. At present, a method of utilizing superconductivity has been proposed but problems of increased costs and of maintenance capability are encountered. Further, the detection sensitivity is about ⅓ inferior to that obtained with the solenoid type detection coil of the present invention.

Comparative Example 3

Figure 9:
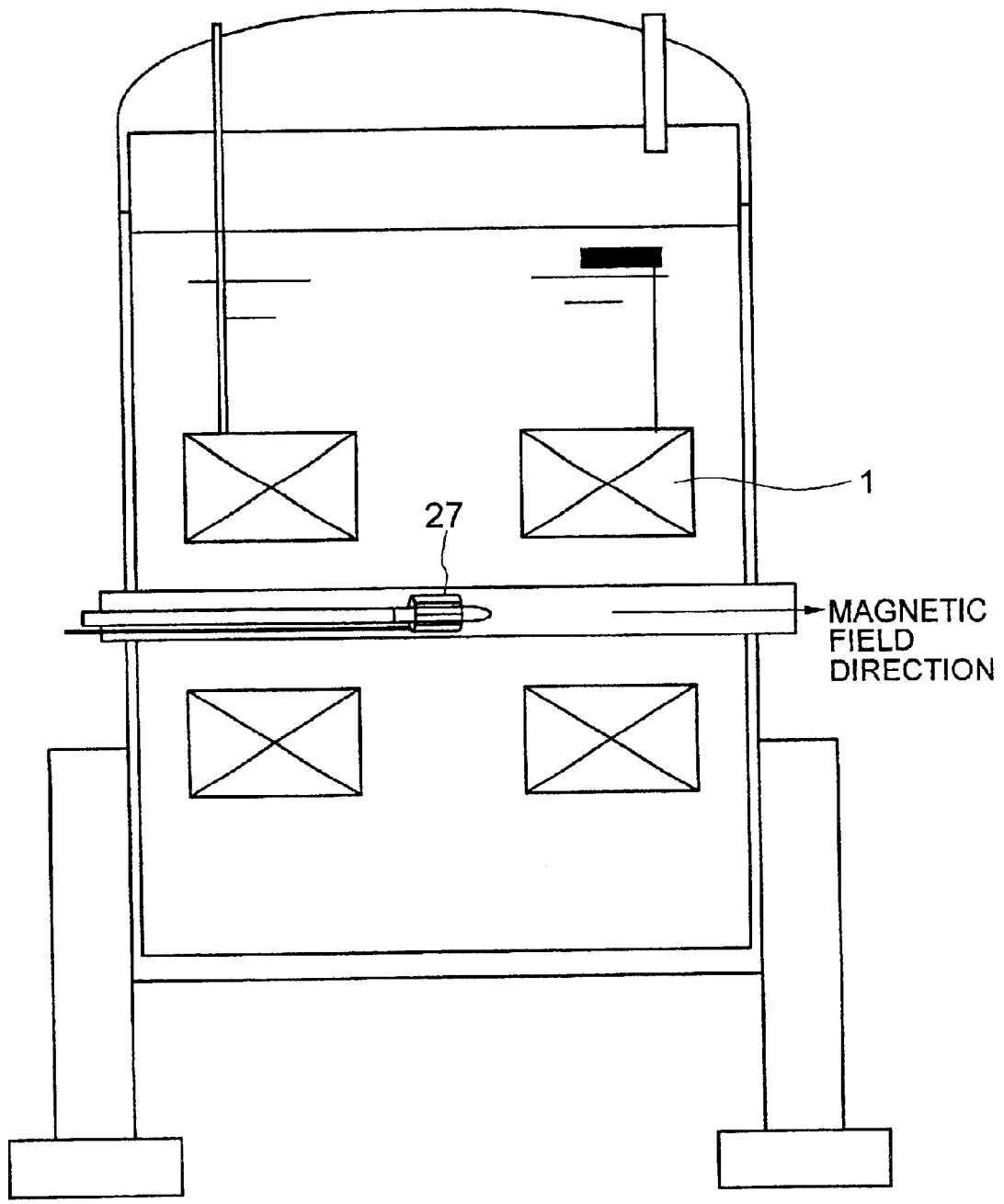
FIG. 9 is a diagram showing construction of a NMR system combination in a comparative example.

An example comparative with the present invention is shown in FIG. 9. In this example, a general NMR solenoid coil for generating a uniform magnetic field in the horizontal direction is used to provide a horizontal magnetic field type arrangement and is used in combination with the cage type detection coil in comparative example 2, whereby a test tube charged with an aqueous solution of protein is inserted in a measuring portion via a horizontal communication hole. A NMR signal at about 400 MHz is obtained by a magnetic field at the measuring portion but in a sample space having a diameter of 10 mm and a length of 20 mm, spatial non-uniformity of magnetic field corresponding to an error of 4 Hz is caused. Further, non-uniformity of magnetic field per hour is 3 Hz/hour. These values are standard ones in the case of the general NMR spectrometer but they are insufficient for analysis of interaction of protein aimed at by the present invention. In addition, during measurement, the solution liquid level in the test tube moves in the horizontal direction and stable measurement often fails to proceed.

Comparative Example 4

Figure 10:
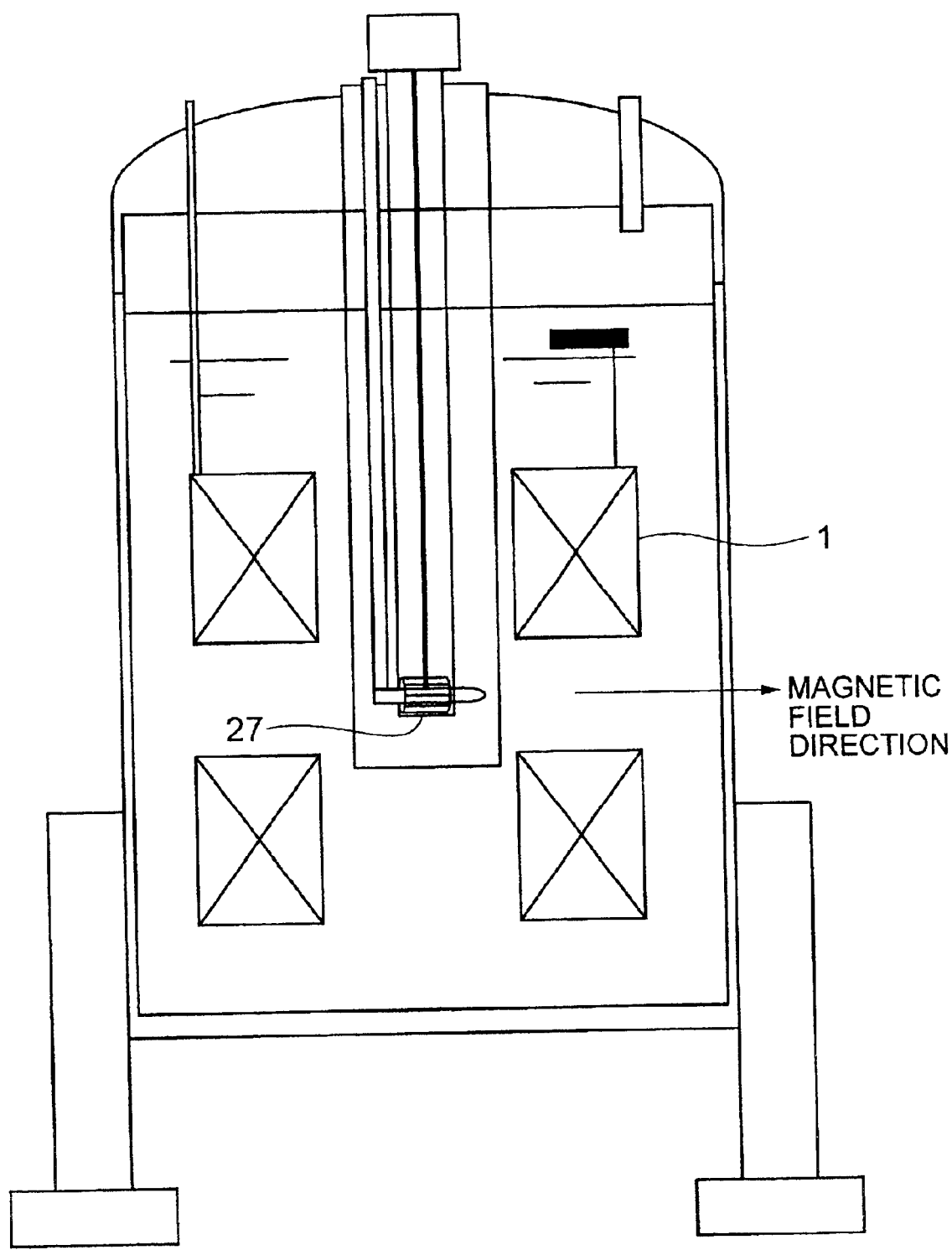
FIG. 10 is a diagram showing combined construction of a NMR system in a comparative example.

An example comparative with the present invention is shown in FIG. 10. A general NMR solenoid coil for generating a uniform magnetic field is used to provide a horizontal magnetic field type arrangement and is passed through a communication hole from above the apparatus to reach a measuring portion so as to be combined with the cage type detection coil of comparative example 2, and an aqueous solution of protein is inserted in a test tube. Since the measuring instrument is inserted from above, the apparatus is increased in size by 200 mm in terms of the maximum diameter of the communication hole. As a result, the center magnetic field intensity is decreased. The magnetic field intensity is adjusted earnestly but a NMR signal only up to 300 MHz can be obtained in the magnetic field center. Further, in the sample space of 10 mm diameter and 20 mm length, there results magnetic non-uniformity corresponding to an error of 5 Hz. These values are standard ones for the general NMR spectrometer but insufficient for interaction analysis of protein.

Comparative Example 5

Figure 11:
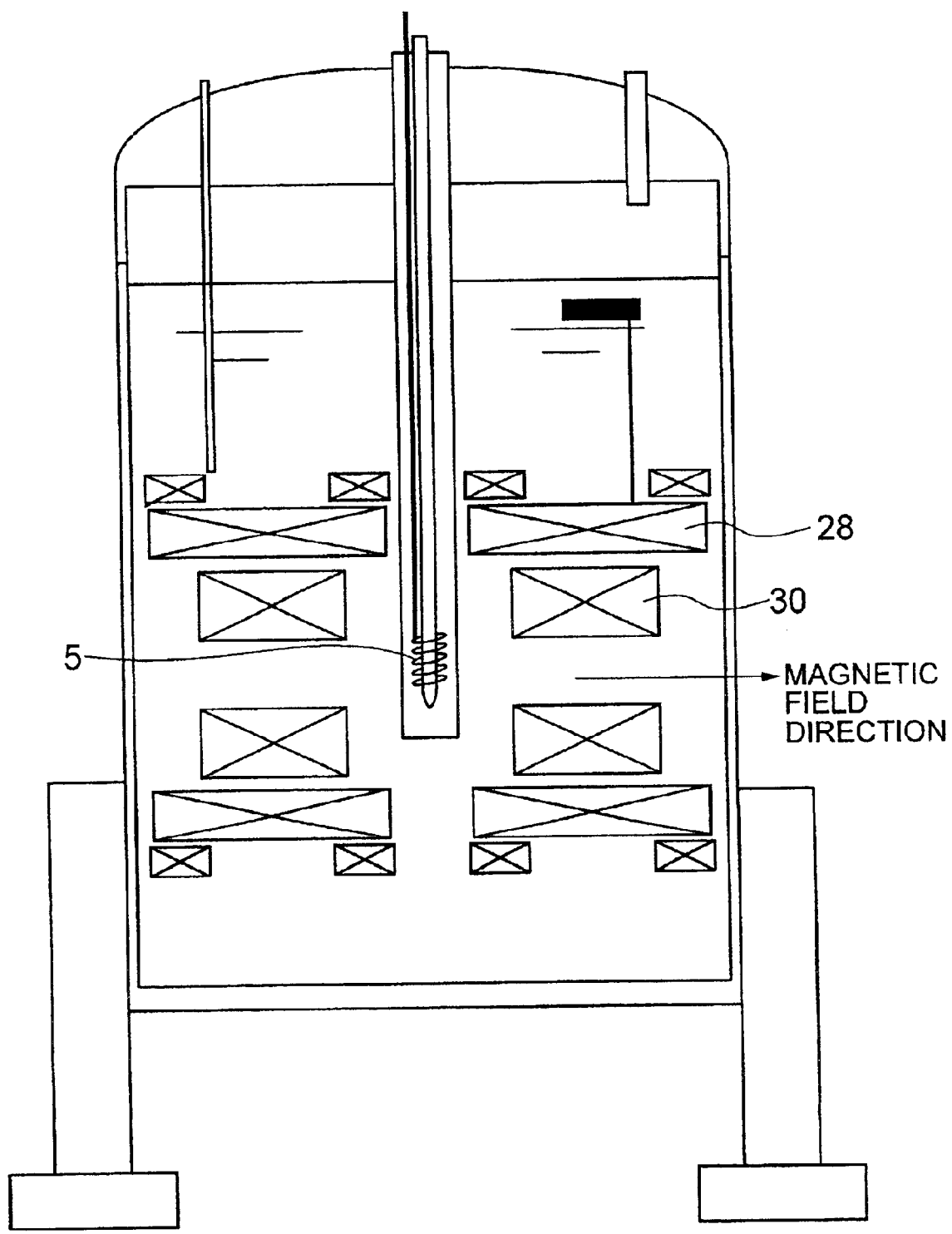
FIG. 11 is a diagram showing combined construction of a NMR system in a comparative example.

An example comparative with the present invention is shown in FIG. 11. Two general NMR solenoid coils of 18 T class for generating a uniform magnetic field are employed in the vertical direction so as to be used in combination with the horizontal magnetic field type arrangement. These two coils are combined with the solenoid type detection coil of the present invention that is passed from above the apparatus through a communication hole of 70 mm diameter to reach a measuring portion. An aqueous solution of protein is inserted in a test tube. All of measuring instruments and liquid-solution sample are inserted from above. As a result, the effective space of the sample is narrowed, amounting to a diameter of 1 mm and a length of 20 mm. With this construction, the volume of the sample can be only ¼₂₅ to ¼₁₀₀ in comparison with the case of the sample tube of a diameter of 5 to 10 mm used for the normal liquid-solution NMR spectrometer and the signal intensity from the sample is decreased to ¼₂₅ to ¼₁₀₀, with the result that in spite of the targeted improvements in sensitivity, the sensitivity is conversely degraded to a great extent. On the other hand, the maximum magnetic field of each magnet is 18 T in the center axis direction of the two magnet systems. Further, the temporal stability of magnetic field is about 0.001 ppm/h. But the stationary magnetic field intensity in the sample space is 7.5 T and the uniformity of the magnetic field in the sample space is 100 ppm or less, proving that the comparative example is on a level not utilizable for measurement by serving as NMR usable for protein analysis.

Comparative Example 6

Figure 12:
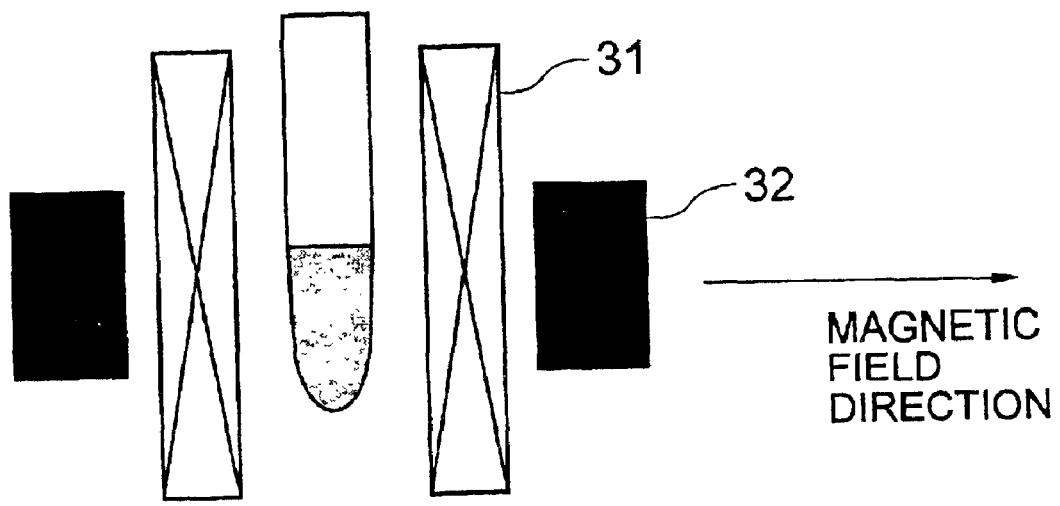
FIG. 12 is a diagram showing combined construction of a NMR system in a comparative example.

An example comparative with the present invention is shown in FIG. 12. In this example, a solenoidally wound detection coil 31 combined with a high-temperature superconductive bulky magnet 32 for generating a magnetic field in the vertical direction is used for NMR measurement of an aqueous solution of protein. The solenoid coil having a winding extensively protruding from the magnetic field uniformity area is characteristic of this example, whereby changes of magnetic flux over a wide range can be fetched on the one hand but on the other hand, the measurement accuracy is inferior to that obtained when the detection coil is arranged in a uniform magnetic field. With the bulky magnet, the maximum magnetic field of the magnet is 10 T but the maximum magnetic field in the sample space is 4 T. The magnetic field uniformity is degraded by non-uniformity of the high-temperature superconductor, amounting to 200 to 500 ppm or less. In addition, the temporal stability of magnetic field is affected by a magnetic flux creeping phenomenon of the high-temperature superconductor, amounting to about 20 to 100 ppm/h. These values prove that the comparative system cannot at all be used for measurement in the form of NMR usable for protein analysis.

As has been described, with the recent advance of protein study, needs for structure analysis of complicated compounds of large molecular weight have been encouraged. Under the circumstances, performance required for NMR has been upgraded year by year and the center magnetic field of NMR has been increased for the sake of improving the detection sensitivity. In principle, the detection sensitivity increases in proportion to the 7/4-th power of the magnetic field but in practice, it is improved in almost direct proportion to the magnetic field. With the existing superconductive materials, improvements in sensitivity reach a limit and the advent of new detection method and apparatus independent of the magnetic field intensity has been sought. According to the invention, in the liquid-solution NMR for protein analysis, the detection sensitivity can be improved by at least 2.5 times of that in the conventional apparatus without increasing the center magnetic field intensity. In the method meeting this effect, the liquid-solution sample is placed in the magnetic field center from above the apparatus, the detection coil in the form of a solenoid coil is placed there from below the apparatus and the magnetic field direction is in the horizontal direction. In terms of the proton NMR frequency necessary for protein analysis, the magnetic field has temporal stability of 1.0 Hz or less per hour and uniformity of 1.0 Hz or less in the sample space. The superconductive magnet is divided into right and left split magnets. In other words, the shape of the detection coil is changed from the conventional cage type 27 to the solenoid type 4 having higher sensitivity. Accordingly, the superconductive magnet differs from the conventional multiplayer air-core solenoids 28, 29 and 30 in that it is constructed of split magnets based on superconductive magnets 1, 2 and 3 that are right and left divided for generating 11 T, preferably, 14.1 T in the horizontal direction. The magnetic field uniformity is set to 0.001 ppm or less and the temporal stability is set to 0.001 ppm or less. By making the detection coil the solenoid type, the measurement of high sensitivity that is 1.4 times the conventional sensitivity can be ensured for the same center magnetic field (resonance frequency) to attain high throughput and the conventionally unattainable NMR detection sensitivity corresponding to 2.5 GHz or 58.75 T can be realized at 900 MHz (21.1 T).

The present invention permits not only the analysis of inter-protein interaction but also the NMR measurement of super-high sensitivity that is higher by 40% of the conventional sensitivity. For example, when the apparatus is operated at a center magnetic field of 900 MHz (21.1 T) that is the highest level attainable by the present-day superconductivity technology, the detection sensitivity corresponding to the conventional 2.5 GHz (58.75 T) can be obtained, whereby the detection sensitivity of super-high sensitivity that is unattainable by the conventional sensitivity improving method relying on the magnetic field intensity can be reached for the first time to advantage.

Further, the present invention is suitable for protein interaction screening study. Conceivably, competition for structure analysis of protein will grow more intensively in the future post-genome age and when the age of utilizing protein clarified in its structure comes, needs for the known interrelation of protein, that is, the interaction screening are expected to be highlighted. More particularly, the interaction screening will be applied widely to the field of tailor-made medicine creation, biotechnology industry, foods and medical treatment. Under a condition that the analysis of stereoscopic structure of protein will have advanced in the 5 to 10 years later forthcoming future, new medicine development positively making advantage of the structure information (so-called medicine creation study) will probably make an advance. In the age for new medicine development as above, the NMR measurement technique of the present invention can be utilized to efficiently promote finding of an unknown interaction between protein known about its structure and ligand or a low molecular compound. For new medicine creation, through a molecular design support combined with calculation simulation based on a new interaction found by NMR, optimized new medicine development will be advanced by making full use of the high-biotechnology. Through the process as above, costs and period for developing a new medicine effectively acting on the human body can be shortened drastically. The spread influence as above has the unfathomable spread influence upon Japan and worldwide mankind. From the technical point of view, the NMR technique of the present invention can improve the detection sensitivity by 2.5 times or more of the conventional detection sensitivity and therefore, the integrating time can be shortened to 1/10. Accordingly, in addition to the aforementioned interaction detection, the influence of a small quantity of metal upon the human body can be studied efficiently. As a concrete example, there is a possibility that the present invention can be applied to development of a remedy for many kinds of diseases affected by a small quantity of elements and protein in vivo, for example, Alzheimer disease and an early diagnosis of chronic/obstinate disease before an attack (diabetes, Creutzfeldt-Jakob disease and the like) by pursuing, on real time base, the influence of metal elements, of substantially the same concentration as that in vivo, upon a existence state of protein and the dynamic state of protein and a small quantity of elements that are marked in vivo. Further, the present measuring technique can improve measuring instruments in maintenance and installation capability drastically and therefore, it is very meritorious to introduce the present measuring technique. Especially, high-quality data approximating that obtained with a large-scale experimental apparatus of 900 MHz class can be obtained with relatively small-scale experimental equipments.

It should be further understood by those skilled in the art that the foregoing description has been made on embodiments of the invention and that various changes and modifications may be made in the invention without departing from the spirit of the invention and the scope of the appended claims.

What is claimed is:

1. A nuclear magnetic resonance spectrometer for liquid-solution which comprises a superconductive magnet including paired split magnets for generating a magnetic field in a horizontal direction, a low temperature container for cooling said superconductive magnet, said low temperature container having a first space perpendicular to a horizontal magnetic field generated by said superconductive magnet and a second space along said horizontal magnetic field generated by said superconductive magnet, a high-frequency transmission coil and a reception coil and in which a sample such as protein dissolved in a liquid-solution is charged in a sample tube of a diameter of 5 to 10 mm, wherein a stationary magnetic field generated by said superconductive magnet is 11 T or more, the direction of the stationary magnetic field generated by said superconductive magnet is in the horizontal direction, a change of proton nuclear magnetic resonance frequency due to a change of said stationary magnetic field is 1.0 Hz/hour or less, the uniformity of said stationary magnetic field in a sample space is 1.0 Hz or less in terms of proton nuclear magnetic resonance frequency, said liquid-solution sample is inserted in the magnetic field center from above said first space, and said reception coil is a solenoid coil inserted in the magnetic field center from below the spectrometer.

2. A nuclear magnetic resonance spectrometer for liquid-solution according to claim 1, wherein said sample is a polymer organic compound, protein or ligand.

3. A nuclear magnetic resonance spectrometer for liquid-solution according to claim 1, wherein said superconductive magnet includes a toroidal magnet placed horizontally.

4. A nuclear magnetic resonance spectrometer for liquid-solution which comprises a superconductive magnet including paired split magnets for generating a magnetic field in a horizontal direction, a low temperature container for cooling said superconductive magnet, said low temperature container having a first space perpendicular to a horizontal magnetic field generated by said superconductive magnet and a second space along said horizontal magnetic field generated by said superconductive magnet, a high-frequency transmission coil and a reception coil and in which a sample such as protein dissolved in a liquid-solution is charged in a sample tube of a diameter of 5 to 10 mm, wherein a stationary magnetic field generated by said superconductive magnet is 11 T or more, the direction of the stationary magnetic field generated by said superconductive magnet is in the horizontal direction, a change of proton nuclear magnetic resonance frequency due to a change of said station magnetic field is 1.0 Hz/hour or less, the uniformity of said stationary magnetic field in a sample space is 1.0 Hz or less in terms of proton nuclear magnetic resonance frequency, said liquid-solution sample is inserted in the magnetic field center from above said first space, and said reception coil is a solenoid coil made of a superconductive material, inserted in the magnetic field center from below the spectrometer and cooled to a superconductivity revealing temperature or less.

5. A nuclear magnetic resonance spectrometer for liquid-solution according to claim 4, wherein said sample is a polymer organic compound, protein or ligand.

6. A nuclear magnetic resonance spectrometer for liquid-solution according to claim 4, wherein said superconductive magnet includes a toroidal magnet placed horizontally.

7. A nuclear magnetic resonance spectrometer for liquid-solution which comprises a superconductive magnet, a low temperature container for cooling said superconductive magnet, said low temperature container having a first space perpendicular to a horizontal magnetic field generated by said superconductive magnet and a second space along said horizontal magnetic field generated by said superconductive magnet, a high-frequency transmission coil and a reception coil and in which sample such as protein dissolved in a liquid-solution is charged in a sample tube of a diameter of 5 to 10 mm, wherein a stationary magnetic field generated by said superconductive magnet is 11 T or more, said superconductive magnet is a toroidal magnet placed in a horizontal direction including paired split magnets for generating a magnetic field in the horizontal direction, a change of proton nuclear magnetic resonance frequency due to a change of said stationary magnetic field is 1.0 Hz/hour or less, the magnetic field uniformity in a sample space is 1.0 Hz or less in terms of proton nuclear magnetic resonance frequency, a plurality of liquid-solution samples are placed circumferentially of the toroidal coil at intervals of substantially equidistance, and the reception coil corresponding to each sample is a solenoid coil made of a superconductive material, inserted in the center of said magnetic field from below the spectrometer and cooled to a superconductivity revealing temperature or less said liquid-solution samples are inserted in the magnetic field center from above said first space.

8. A nuclear magnetic resonance spectrometer for liquid-solution according to claim 7, wherein said superconductive magnet is a toroidal magnet placed horizontally and in order to discriminate nuclear magnetic resonance signals generated from adjacent plural samples from each other, the magnetic field intensity applied to the individual samples is regulated.

* * * * *